United States Patent
Lee et al.

(10) Patent No.: US 7,808,044 B2
(45) Date of Patent: Oct. 5, 2010

(54) THIN FILM TRANSISTOR SUBSTRATE AND METHOD OF MAKING THE SAME

(75) Inventors: Yong-uk Lee, Gyeonggi-do (KR); Joon-hak Oh, Gyeonggi-do (KR); Bo-sung Kim, Seoul (KR); Mun-pyo Hong, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1082 days.

(21) Appl. No.: 11/495,911

(22) Filed: Jul. 27, 2006

(65) Prior Publication Data

US 2007/0023837 A1 Feb. 1, 2007

(30) Foreign Application Priority Data

Jul. 27, 2005 (KR) .................... 10-2005-0068553

(51) Int. Cl.
*H01L 27/12* (2006.01)

(52) U.S. Cl. ............................. 257/347; 257/40; 257/72

(58) Field of Classification Search .................... 257/40, 257/642, E39.007, E21.007, E21.024, E21.259, 257/57, 59, 66, 72, 83, 257, 290, 347, E51.005; 438/30, 48, 128, 149, 151, 157, 161, 283

See application file for complete search history.

(56) References Cited

U.S. PATENT DOCUMENTS

| | | | |
|---|---|---|---|
| 6,203,912 B1 * | 3/2001 | Watakabe et al. | ........... 428/421 |
| 6,300,988 B1 * | 10/2001 | Ishihara et al. | ................ 349/43 |
| 6,429,916 B1 | 8/2002 | Nakata et al. | |
| 6,821,811 B2 | 11/2004 | Hirakata et al. | |
| 7,067,841 B2 * | 6/2006 | Parker | .......................... 257/40 |
| 2005/0062040 A1 * | 3/2005 | Wong et al. | .................... 257/40 |
| 2005/0104058 A1 * | 5/2005 | Veres et al. | .................... 257/40 |

FOREIGN PATENT DOCUMENTS

| | | |
|---|---|---|
| CN | 1585100 | 2/2003 |
| CN | 1398359 | 2/2005 |
| JP | 09-213690 | 8/1997 |
| JP | 2000-269504 | 9/2000 |
| JP | 2002-365640 | 12/2002 |

(Continued)

OTHER PUBLICATIONS

Patent Abstracts of Japan, Publication No. 2004-363560, Dec. 24, 2004, 1 p.

(Continued)

*Primary Examiner*—Wai-Sing Louie
*Assistant Examiner*—Sue Tang
(74) *Attorney, Agent, or Firm*—Innovation Counsel LLP

(57) ABSTRACT

The present invention relates to a thin film transistor substrate comprising: an insulating substrate; a source electrode and a drain electrode which are formed on the insulating substrate and separated from each other and have a channel area therebetween; a wall exposing at least portions of the source electrode and the drain electrode, respectively, encompassing the channel area, and formed of fluoropolymer; and an organic semiconductor layer formed inside the wall. Thus, the present invention provides a TFT substrate where an organic semiconductor layer is planarized. Further, the present invention also provides a method of making a TFT substrate of which an organic semiconductor layer is planarized.

21 Claims, 12 Drawing Sheets

FOREIGN PATENT DOCUMENTS

| | | |
|---|---|---|
| JP | 2003-508797 | 3/2003 |
| JP | 2004-080026 | 3/2004 |
| JP | 2004-088090 | 3/2004 |
| JP | 2004-186393 | 7/2004 |
| JP | 2004-363560 | 12/2004 |
| JP | 2005-101558 | 4/2005 |
| JP | 2005-150640 | 6/2005 |
| JP | 2005-251987 | 9/2005 |
| KR | 2001-0012686 | 2/2001 |
| KR | 2003-0051178 | 6/2003 |
| WO | 03083960 A1 | 10/2003 |

OTHER PUBLICATIONS

English Language Abstract, Publication No. 2001-012686, 1 p.
Korean Patent Abstracts, Publication No. 1020030051178, Jun. 25, 2003, 1 p.

* cited by examiner

THIN FILM TRANSISTOR SUBSTRATE AND METHOD OF MAKING THE SAME

CROSS-REFERENCE TO RELATED APPLICATIONS

This application claims the benefit of Korean Patent Application No. 2005-0068553, filed on Jul. 27, 2005, in the Korean Intellectual Property Office, which is hereby incorporated by reference for all purposes as if fully set forth herein.

FIELD OF THE INVENTION

The present invention relates to a thin film transistor substrate in which a wall is formed of fluoropolymer to planarize an organic semiconductor layer.

DESCRIPTION OF THE RELATED ART

A liquid crystal display (LCD) includes an LCD panel comprising a thin film transistor (TFT) substrate where TFTs are formed, a color filter substrate where color filter layers are formed, and a liquid crystal layer interposed between both substrates. The LCD panel does not emit light by itself, therefore a backlight unit is disposed in a rear of the TFT substrate to provide light. Transmittance of light is controlled according to alignment of the liquid crystal layer. The TFT includes a gate electrode, a drain electrode, a source electrode, and a semiconductor layer. The semiconductor layer may be formed of amorphous silicon or poly silicon or of an organic semiconductor. The organic semiconductor is formed at normal temperature and pressure, therefore manufacturing cost may be reduced and a plastic substrate, vulnerable to heat, may be used. Further, the display device is flexible when using the plastic substrate. The organic semiconductor may be formed by an ink-jet method without passing through processes of spin coating, exposing, development. When the organic semiconductor is formed by the ink-jet method, a wall should encompass the organic semiconductor. The surface of the wall is made water and oil repellant by being treated before the organic semiconductor is formed. However treating with CF4 plasma, which treats an inner part of the wall where the organic semiconductor is disposed as well as the wall, fails to planarize the organic semiconductor and the wall fails to retain water and oil repellency.

SUMMARY OF THE INVENTION

The present invention provides a TFT substrate where an organic semiconductor layer is planarized. According to an embodiment of the invention, there is provided a thin film transistor substrate comprising: an insulating substrate; a source electrode and a drain electrode which are formed on the insulating substrate and separated from each other and have a channel area therebetween; a wall exposing at least portions of the source electrode and the drain electrode, respectively, encompassing the channel area, and formed of fluoropolymer; and an organic semiconductor layer formed inside the wall. Illustratively, the wall may be made of poly tetra fluoro ethylene (PTFE), fluorinated ethylene propylene (FEP), poly fluoro alkoxy (PFA), ethylene tetra fluoro ethylene (ETFE), polyvinylidene fluoride (PVDF), or cyclized transparent polymer generated by copolymerization of perfluoro (alkenylfinyl ethers). The organic semiconductor layer is one of a derivative including substituent of tetracene or pentacene; 4~8 oligothiopene connected to 2, 5 position of thiopene ring; perylenetetracarboxilic dianhidride or an imide derivative thereof; naphthalenetetracarboxilic dianhydride or an imide derivative thereof; metallized pthalocyanine or a halogenated derivatives thereof, or perylene, coroene or derivatives including substituents thereof; co-oligomer or co-polymer of thienylene and vinylene; thiopene; perylene or coroene, or derivatives including substituents thereof; and derivatives including one or more hydrocarbon chains of 1~30 carbons to aromatic or heteroaromatic ring of the aforementioned materials.

BRIEF DESCRIPTION OF THE DRAWINGS

The accompanying drawings, which are included to provide a further understanding of the invention, together with the description serve to explain the principles of the invention, in which.

DETAILED DESCRIPTION

Figure 1:
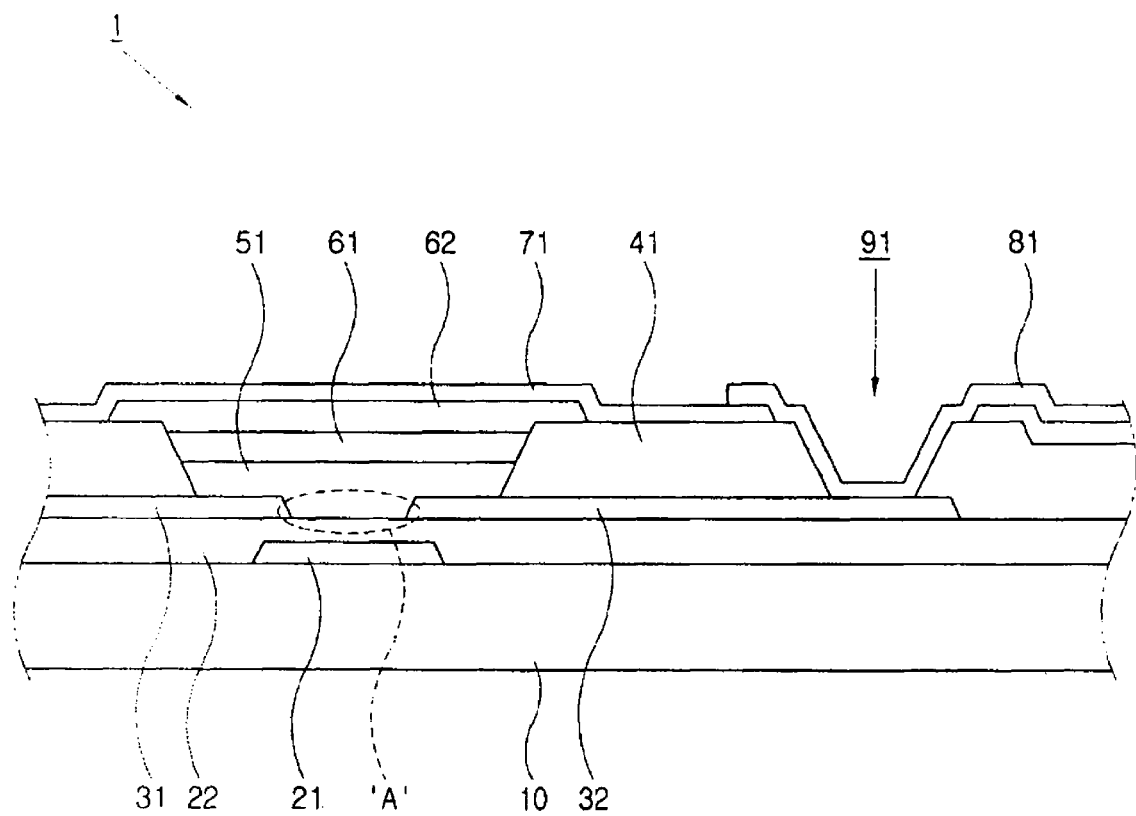
FIG. 1 is a sectional view of a TFT substrate according to a first embodiment of the invention.

FIG. 1 is a sectional view of a TFT substrate according to a first embodiment of the present invention. A TFT substrate 1 includes an insulating substrate 10, a source electrode 31 and a drain electrode 32 which are formed on the insulating substrate 10 and separated from each other, a wall 41 exposing a portion of the source electrode 31 and a portion of the drain electrode 32, and an organic semiconductor layer 51 disposed in the wall 41. The insulating substrate 10 is made of glass or plastic. When the insulating layer 10 is made of plastic, the TFT substrate 1 is flexible but is vulnerable to heat. The organic semiconductor layer 51 may be made of plastic because of being formed at normal temperature and pressure. The plastic may be polycarbon, polyimide, polyethersulfone (PES), polyarylate (PAR), polyethylenenaphthalate (PEN), and polyethyleneterephthalate (PET).

A light shield layer 21 is formed on the insulating substrate 10 and an insulating layer 22 is formed on the light shield layer 21. The TFT according to the first embodiment is formed in a top-gate type the way the gate electrode 62 is disposed on the organic semiconductor layer 51. Accordingly, the gate electrode 62 does not prevent light incident from the downside of the insulating substrate 10 being incident to the organic semiconductor layer 51. The organic semiconductor layer 51 changes its property under the light to make function of the TFT non-uniform, which is prevented by the light shield layer 21. The light shield layer 21 is formed of non-transparent material, such as chrome (Cr) or alloy of molybdenum and tungsten (MoW). When the TFT substrate 1 is used for an LCD, the light may be incident from a backlight unit form the downside of the insulating substrate 10. The light shield layer 21 covers a portion of the organic semiconductor 51 across a channel area 'A' influencing property of the TFT in the exemplary embodiment, but may cover all the organic semiconductor layer 51.

The insulating layer 22 disposed on the light shield layer 21 prevents the light shield layer 21 functioning as a floating electrode and planarizes the light shield layer 21. The insulating layer 22 should have excellent light transmittance and be stable in the process. The insulating layer 22 may be an organic layer such as benzocyclobutene (BCB), an acryl photoresist layer, or a double layer of an organic layer and an inorganic layer. In case of the double layer of the organic layer and the inorganic layer, the inorganic layer may be a silicon nitride layer having hundreds of Å thick and prevents impurities flowing into the organic semiconductor 51 from the organic layer.

The source electrode 31 and the drain electrode 32 are formed on the insulating layer 22. The source electrode 31 and the drain electrode 32 are separated from each other at a predetermined interval and the channel area 'A' is formed between the source electrode 31 and the drain electrode 32. The source electrode 31 and the drain electrode 32 are formed by a deposition and a photolithography.

The wall 41 is formed on the source electrode 31, the drain electrode 32 and an area of the insulating layer 22 not covered with the source electrode 31. A portion of the wall 41 encompasses the channel area 'A' and exposes a portion of the source electrode 31 and the drain electrode 32. The wall 41 functions as a frame of the organic semiconductor layer 51. The organic semiconductor may spread in different degrees to be formed non-uniformly when the deposited size of the organic semiconductor is large, when the organic semiconductor is not dropped in a proper location, or when the deposited size is different from one another. The wall 41 prevents the organic semiconductor layer 51 being formed non-uniformly by determining the deposited position of the ink in an ink-jet method.

The wall 41 encompassing the channel area 'A' tapers, becoming gradually narrower at the upper part, and is about 2.7 μm high. A drain contact hole 91 is provided in a portion of the wall 41 to expose the drain electrode 32. The wall 41 is formed of fluoropolymer. Preferably, the wall 41 is hydrophobic if the ink is hydrophilic, and the wall 41 is hydrophilic if the ink is hydrophobic so as to deposit the ink at the desired location. The fluoropolymer has both water repellency and oil repellency. The fluoropolymer may be polytetrafluoro ethylene (PTFE), fluorinated ethylene propylene (FEP), poly fluoro alkoxy (PFA), ethylene tetra fluoro ethylene (ETFE), polyvinylidene fluoride (PVDF), or the like. PTFE has structural formula 1, can withstand high temperatures (up to 290° C.), has a very low coefficient of friction, and is excellent in wear resistance and chemical resistance.

Structural formula 1:

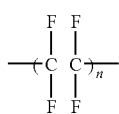

FEP has structural formula 2 has excellent chemical and corrosion resistance, and is non-sticking.

Structural formula 2:

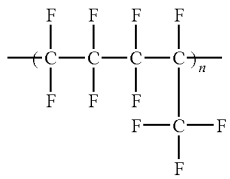

PFA has better durability than PTFE or FEP has excellent in chemical resistance. ETFE has structural formula 3. ETFE is not completely fluorinated, but has excellent chemical resistance, rigidity, and durability.

Structural formula 3:

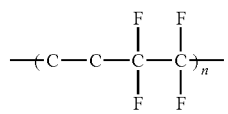

PVDF has excellent mechanical properties.

Alternatively, the fluoropolymer "Cytop" made by Asahi Glass in Japan may be used. "Cytop" is a cyclized transparent polymer generated by copolymerizing perfluoro (alkenylvinyl ethers). "Cytop" is excellent in thermal resistance, chemical resistance, water repellency, and oil repellency. Wall 41 may be formed using a photoresist process that includes coating, exposure, and development processes, or wall 41 may be coated and formed by photolithography without photoresist.

Organic semiconductor layer 51 is formed on the wall 41 and covers the channel area 'A', the source electrode 31 and the drain electrode 32. Organic semiconductor layer 51 may be formed by the ink-jet method using polymer or low molecular material capable of being dissolved in a water solution or an organic solvent. An organic semiconductor polymer is generally dissolved in a solvent well to be suitable for the ink-jet method. However, a low molecular organic semiconductor which is dissolved in the organic solvent may be used in the ink-jet method. Organic semiconductor layer 51 may be a derivative including substituent of tetracene or pentacene, or oligothiopene including 4~8 thiopene monomer connected to 2, 5 position of thiopene ring. Organic semiconductor layer 51 may be perylenetetracarboxilic dianhidride (PTCDA) or an imide derivative thereof, or naphthalenetetracarboxilic dianhydride (NTCDA) or an imide derivative thereof. Organic semiconductor layer 51 may be metallized pthalocyanine or halogenated derivatives thereof, or perylene, coroene or derivatives including substituents thereof. It is preferable that metal added to the metalized pthalocyanine is copper, cobalt, zinc, or the like. Organic semiconductor layer 51 may be co-oligomer or co-polymer of thienylene and vinylene, thienylene or coroene, or derivatives including substituents thereof. Organic semiconductor layer 51 may be derivatives including one or more hydrocarbon chains of 1~30 carbons to aromatic or heteroaromatic ring of the aforementioned derivatives.

Organic insulating layer 61 is formed on the organic semiconductor layer 51. When the organic semiconductor layer 51 contacts with the gate electrode 62 or there is an inorganic insulating layer is disposed between the organic semiconductor layer 51 and the gate electrode 62, the property of the organic semiconductor layer 51 may become deteriorated. The organic insulating layer 61 prevents the organic semiconductor layer 51 from contacting with the gate electrode 62 and maintains the property of the organic semiconductor layer 51. The organic semiconductor layer 51 is formed lower than the wall 41 by the ink-jet method.

Gate electrode 62 is disposed on the organic insulating layer 61 over the channel area 'A'. The gate electrode 62 is a single-metal layer or a multi-metal layer. A passivation layer 71 is formed on the gate eletrode 62. The passivation layer 71 is made of an acryl photoresist organic layer or a silicon nitride layer, and is removed where the drain contact hole 91 is disposed, which exposes the drain electrode 32.

Pixel electrode 81 is formed on the passivation layer 71. The pixel electrode 81 is made of transparent conductive material such as indium tin oxide (ITO) or indium zinc oxide (IZO), and contacts with the drain electrode 32 through the drain contact hole 91.

The method of making the TFT substrate according to the first embodiment of the present invention will be described as referring to FIGS. 2a through 2F. Referring to FIG. 2, the light shield layer 21, the insulating layer 22, the source electrode 31, and the drain electrode 32 are formed on the insulating substrate 10. The insulating substrate 10 may be glass, silicon, or plastic. Light shield layer 21 is formed by depositing a metal layer of Cr, MoW, or the like on the insulating substrate 10 by a sputtering method, then etching it by photolithography. The insulating layer 22 is formed by a spin coating or a slit coating if being an organic layer; and by a chemical vapor deposition (CVD) or a plasma enhanced chemical vapor deposition (PECVD) if being an inorganic layer.

Figure 2A:
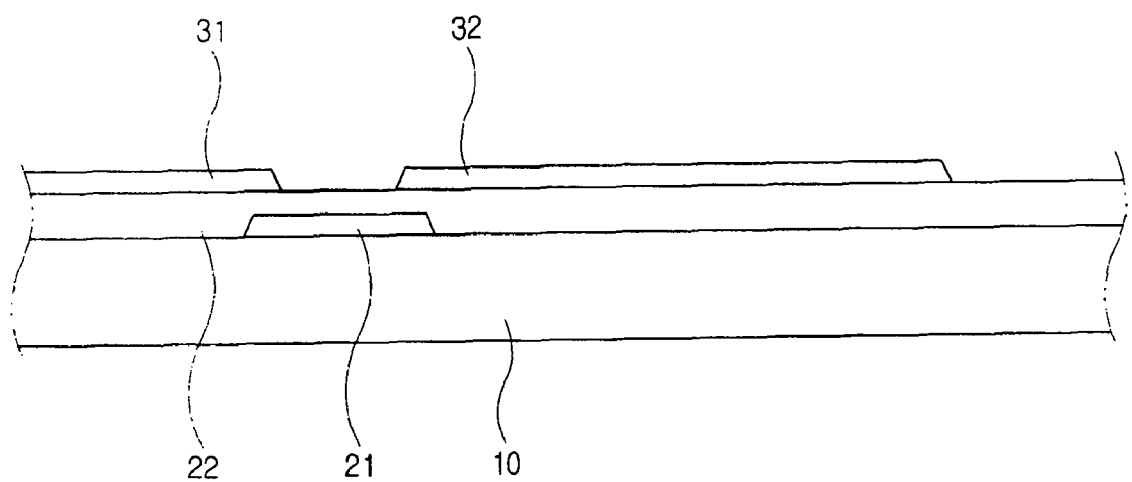
FIGS. 2a through 2f are sectional views to illustrate a method of making the TFT substrate sequentially according to the first embodiment.
Figure 2B:
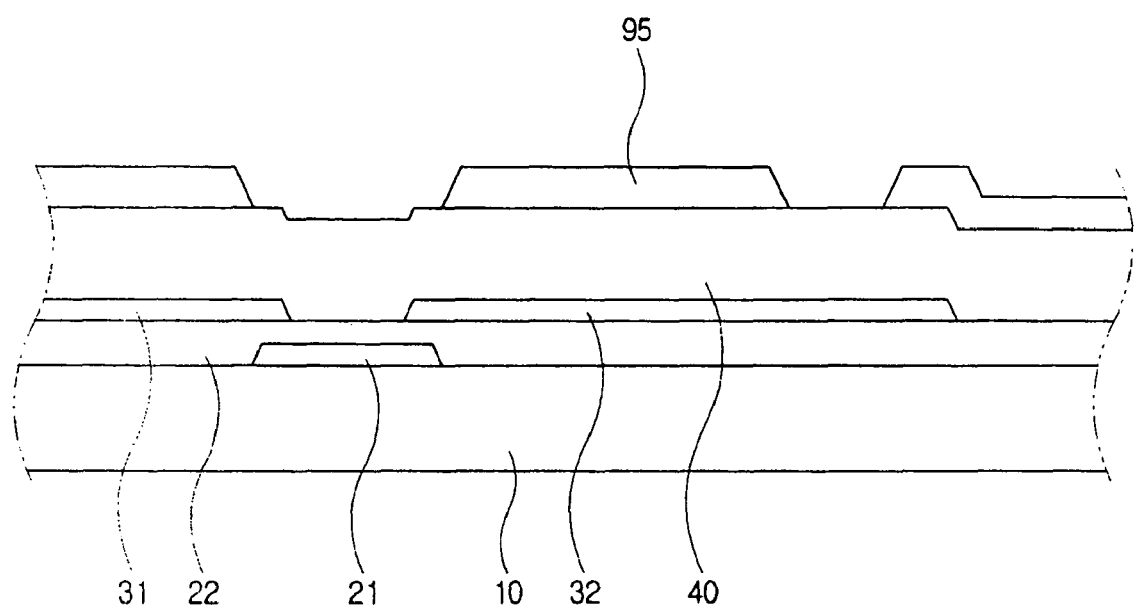

Source electrode 31 and the drain electrode 32 are formed by depositing a metal layer on the insulating substrate 10, then etching it by photolithography. The source electrode 31 and the drain electrode 32 are separated from each other to define the channel area 'A'. Referring to FIG. 2b, a wall coating layer 40 is formed to form the wall 41 and a photoresist layer pattern 95 is formed thereon.

Wall coating layer 40 is formed by dissolving fluoropolymer in a solvent, coating it by the slit coating or the spin coating, and then removing the solvent. The photoresist layer pattern 95 is formed on the wall coating layer 40, just where the wall 41 is formed. Then, the wall coating layer 40 where the photoresist pattern 95 is not disposed is etched to form the wall 41. When the fluoropolymer comprised in the wall 41 is photoresist, the wall 41 is formed without using the photoresist layer pattern 95. Namely, the wall 41 is formed by exposing and developing the wall coating layer 40.

Figure 2C:
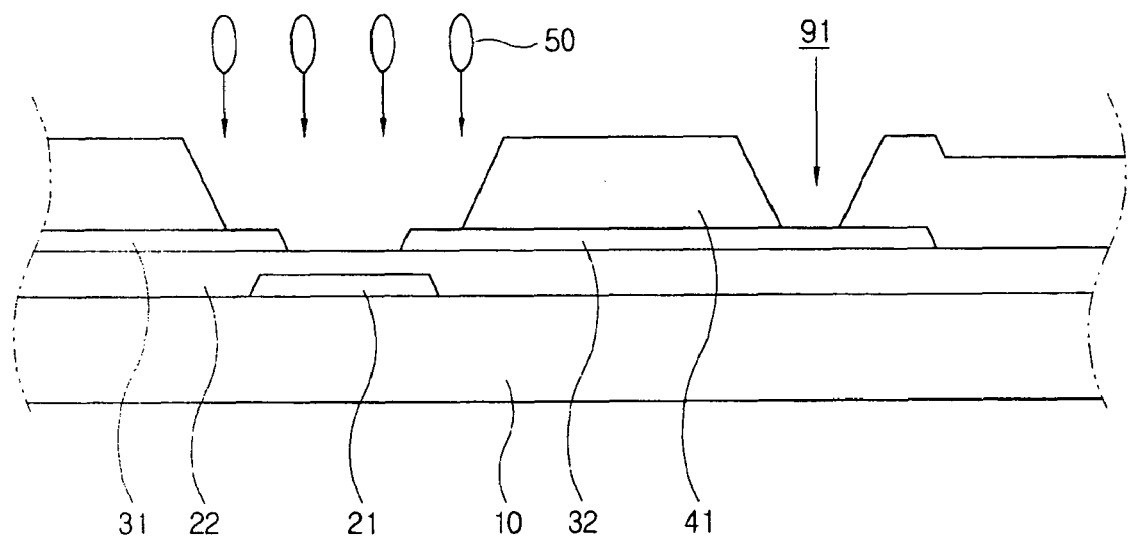

Referring to FIG. 2c, an organic semiconductor solution 50 is dropped to the channel area encompassed by the wall 41 by the ink-jet method. The organic semiconductor solution 50 may be hydrophilic or oleophilic according to a solvent. A portion of the organic semiconductor solution 50 may be dropped to a lateral side of the wall 41. The wall 41 according to the present invention includes fluoropolymer having both water repellency and oil repellency, therefore the organic semiconductor solution 50, which is dropped to the lateral side of the wall 41, flows along the lateral side of the wall 41 into the channel area. However, the wall 41 only has the water repellency and the oil repellency, but the insulating layer 22, the source electrode 31, and the drain electrode 32 which contact with the organic semiconductor solution 50 do not have the water repellency and the oil repellency because of not being treated on their surfaces. Therefore, the organic semiconductor solution 50 is planarized in the channel area and a circumference thereof. The solvent is removed from the organic semiconductor solution 50 to form the organic semiconductor layer 51, which is planarized as well.

Figure 2D:
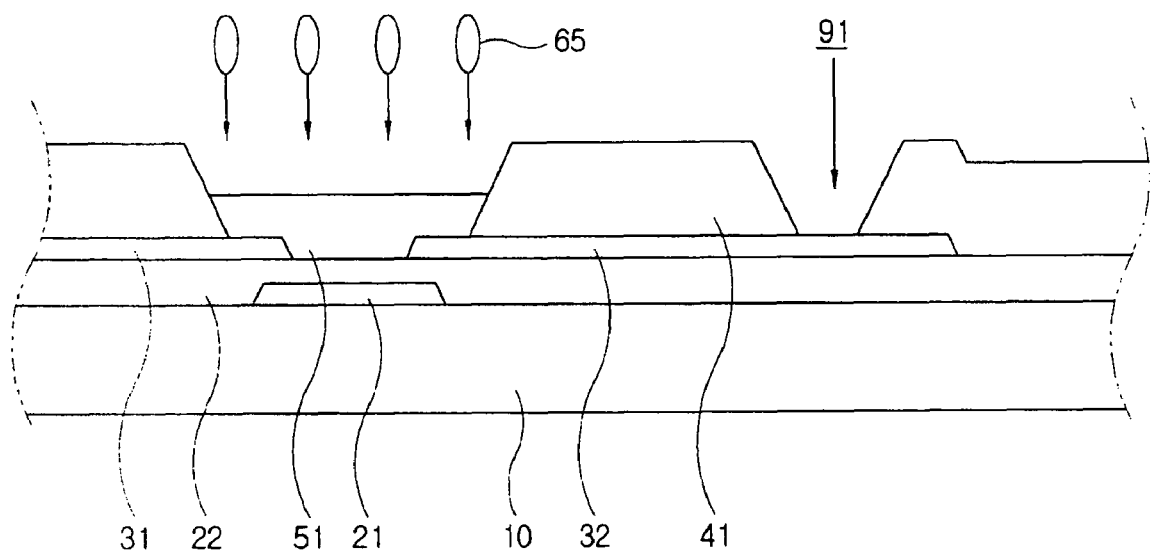

Referring to FIG. 2d, an organic insulating layer solution 65 is deposited on the organic semiconductor layer 51. The organic insulating layer solution 65 may be aqueous or oily according to a solvent. A portion of the organic insulating layer solution 65 may be dropped to the lateral side of the wall 41. The wall 41 includes fluoropolymer having both water repellency and oil repellency, therefore the organic insulating layer solution 65, which is dropped to the lateral side of the wall 41, flows along the lateral side of the wall 41 into the organic semiconductor layer 51. Therefore, the organic insulating layer solution 65 is planarized in the organic semiconductor layer 51. The solvent is removed from the organic insulating layer solution 65 to form the organic insulating layer 61, which is planarized as well.

The water repellency and the oil repellency of the wall 41 come from the fluoropolymer, not from a plasma process. Accordingly, the water repellency and the oil repellency of the wall 41 do not weaken while the organic semiconductor layer 51 and the organic insulating layer 61 are formed and remain permanent. Wall 41 comprised of the fluoropolymer is formed, and then the source electrode 31, the drain electrode 32, and the insulating layer 22 are adjusted in their properties by the plasma process.

Figure 2E:
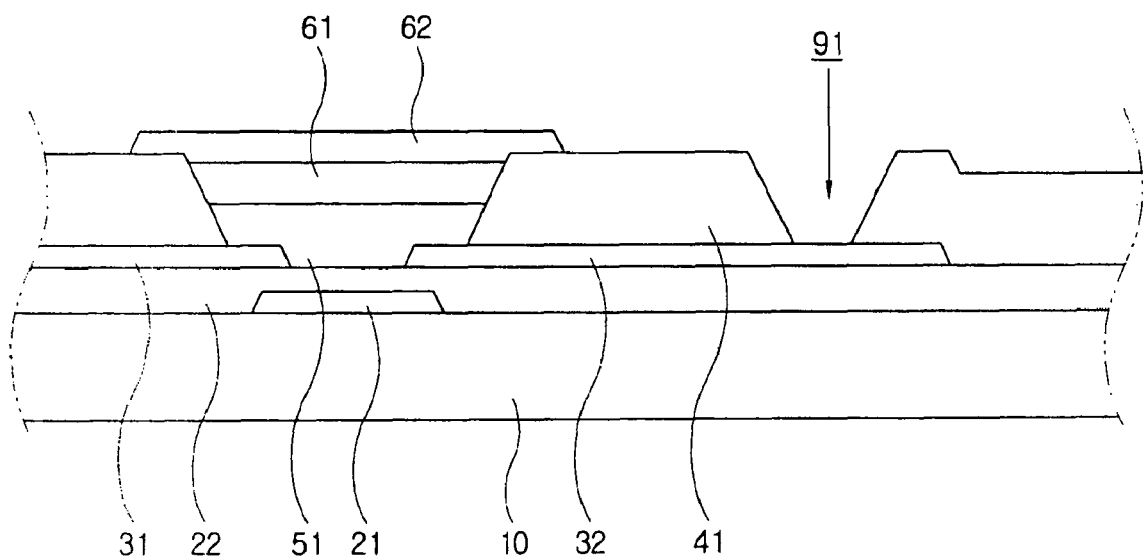

Referring to FIG. 2e, the gate electrode 62 is formed on the organic insulating layer 61. The gate electrode 62 is formed by depositing a metal layer on the insulating layer 10 by the sputtering method, and etching it by the photolithography. The gate electrode 62 may be a metal-single layer or a metal-multi layer.

Figure 2F:
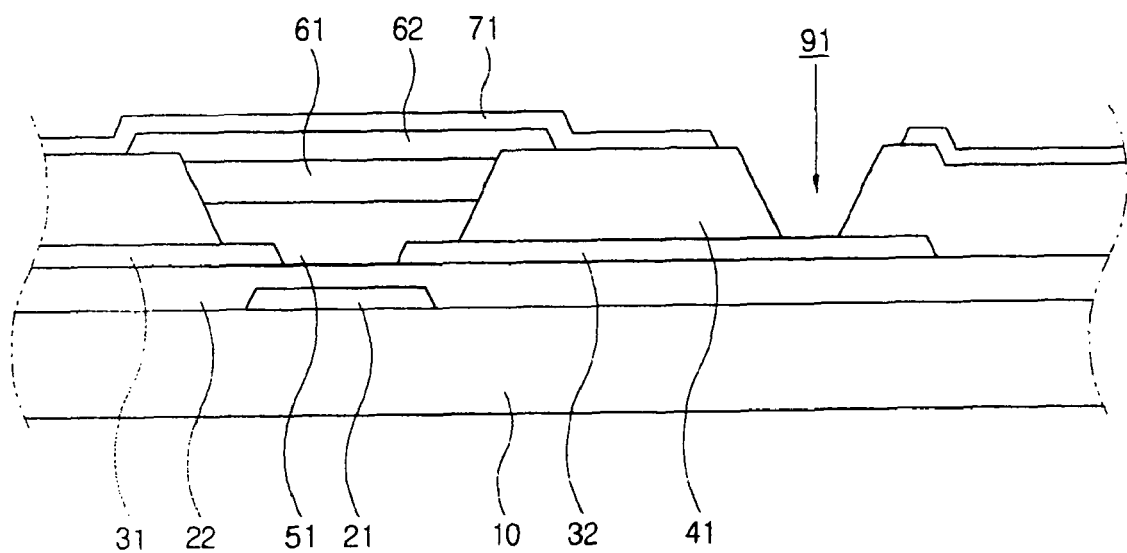

Referring to FIG. 2f, the passivation layer 71 is formed on the gate electrode 62 and the wall 41. The passivation layer 71 is removed where the drain contact hole 91 is disposed. The passivation layer 71 is formed through coating, exposure, and development if made of a photoresist organic layer, and it is formed through deposition and photolithography if made of an inorganic layer such as silicon nitride. Finally, the pixel electrode 81 is formed to finish the TFT substrate 1 in FIG. 1. The pixel electrode 81 contacts with the drain electrode 31 through the drain contact hole 91.

Figure 3:
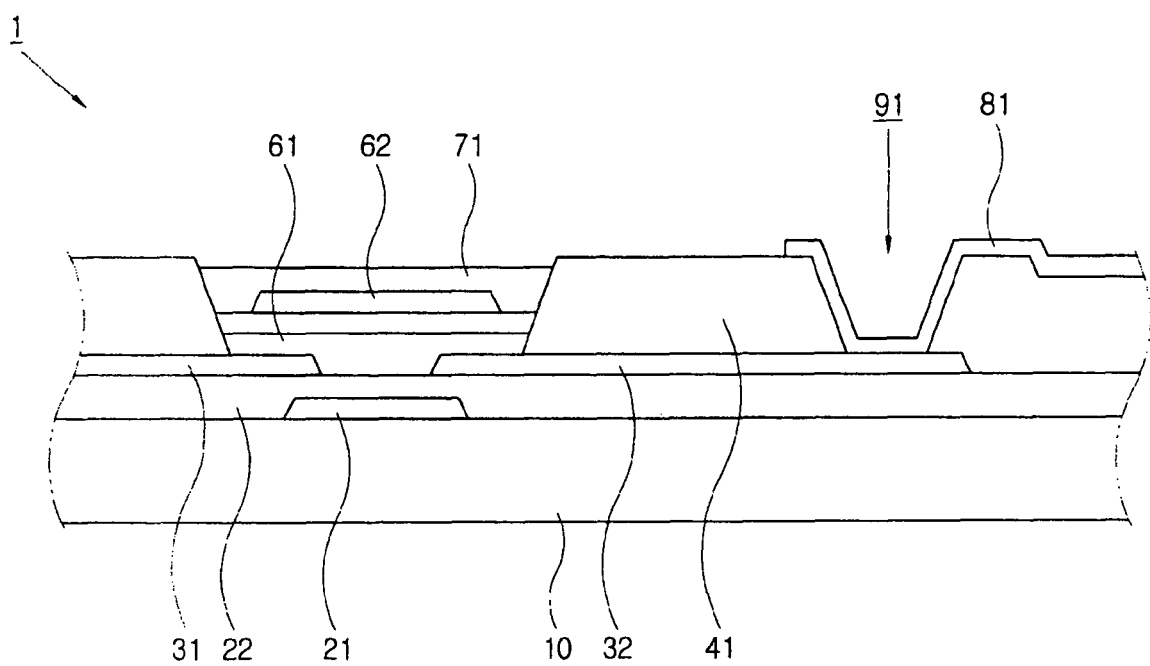
FIGS. 3 through 7 are sectional views of TFT substrates according to a second embodiment through a sixth embodiment.

FIGS. 3 through 7 are sectional views of TFT substrates according to a second embodiment through a sixth embodiment of the present invention. In the followings, the TFT substrate is described as focusing on difference between the first embodiment and the others. As shown in FIG. 3, a gate electrode 62 and a passivation layer 71 are disposed inside a wall 41 in a TFT substrate 1 according to a second embodiment. The passivation layer 71 according to the second embodiment, as well as an organic semiconductor layer 51 and an organic insulating layer 61, is formed by an ink-jet method. Accordingly, the passivation layer 71 is formed lower than the wall 41. Water repellency and oil repellency of the wall 41 come from the fluoropolymer, not from a plasma process. Accordingly, the water repellency and the oil repellency of the wall 41 do not weaken while the organic semiconductor layer 51, the organic insulating layer 61, and the passivation layer 71 are formed.

Figure 4:
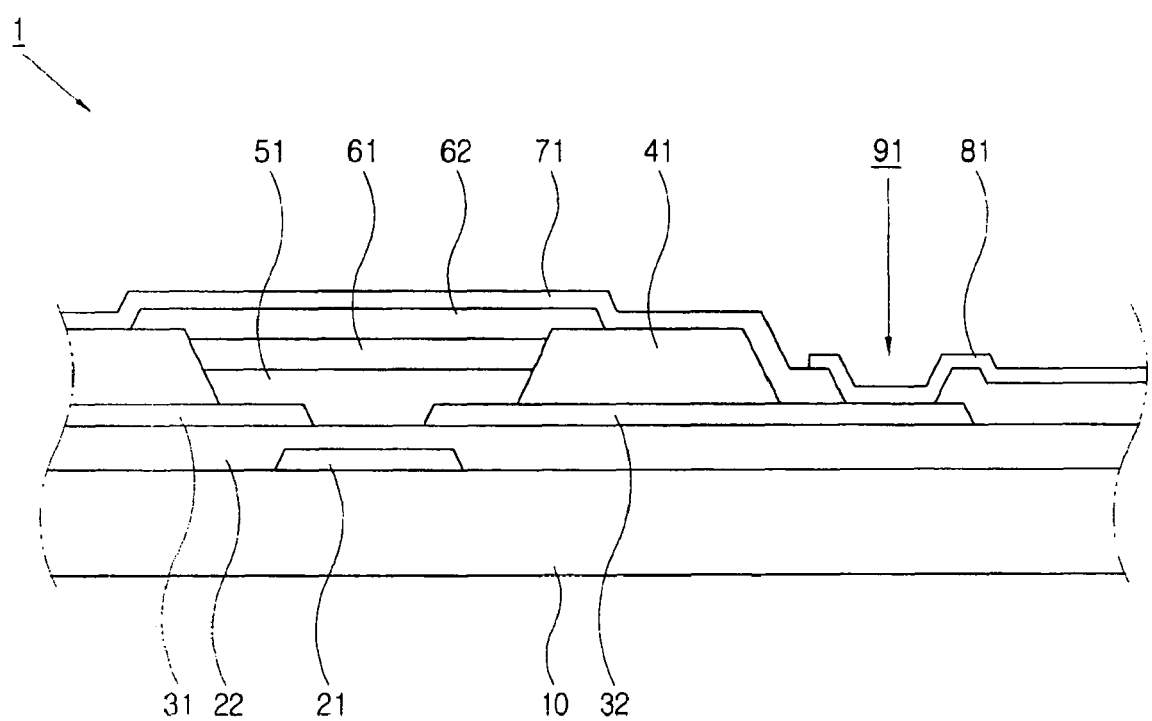

As shown in FIG. 4, a wall 41 encompasses a channel area and is not disposed below the pixel electrode 81 in a TFT substrate 1 according to a third embodiment. Accordingly, the only passivation layer 71 is removed where the drain contact hole 91, exposing a drain electrode 32, is disposed.

Figure 5:
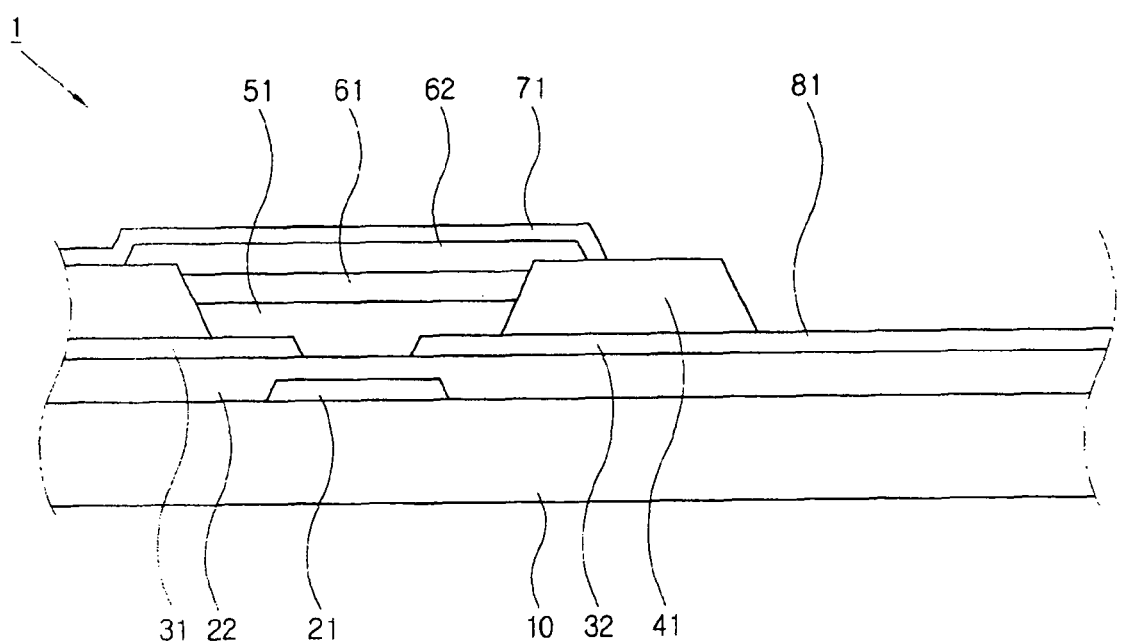

As shown in FIG. 5, a source electrode 31 and a drain electrode 32 are made of ITO or IZO, wherein the drain electrode 32 is formed in a single body with a pixel electrode 81 in a TFT substrate 1 according to a fourth embodiment. Furthermore, a wall 41 and a passivation layer 71 are not formed on the pixel electrode 81 to prevent brightness decreasing.

Figure 6:
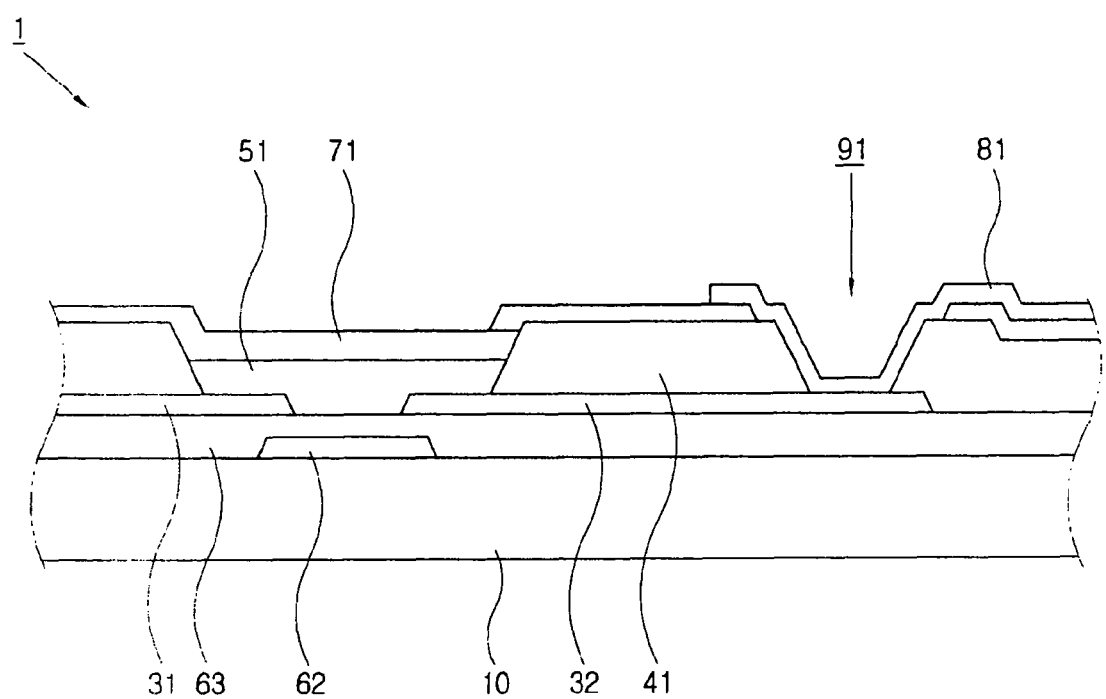

As shown in FIG. 6, a TFT substrate 1 according to a fifth embodiment is formed in a bottom-gate type the way a gate electrode 62 is disposed below an organic semiconductor layer 51, in a different way of the first embodiment. A metal shielding pattern 21 is not formed since the gate electrode 62 intercepts light incident from a lower part of an insulating substrate 10. A gate insulating layer 63 is disposed between the gate electrode 62 and the organic semiconductor layer 51. The gate insulating layer 63 may be an organic layer, an inorganic layer, or a double layer of an organic layer and an inorganic layer. According to the fifth embodiment, there is no process except forming the passivation layer 71 after the organic semiconductor layer 51 is formed, therefore there may be less quality deterioration of the organic semiconductor layer 51.

Figure 7:
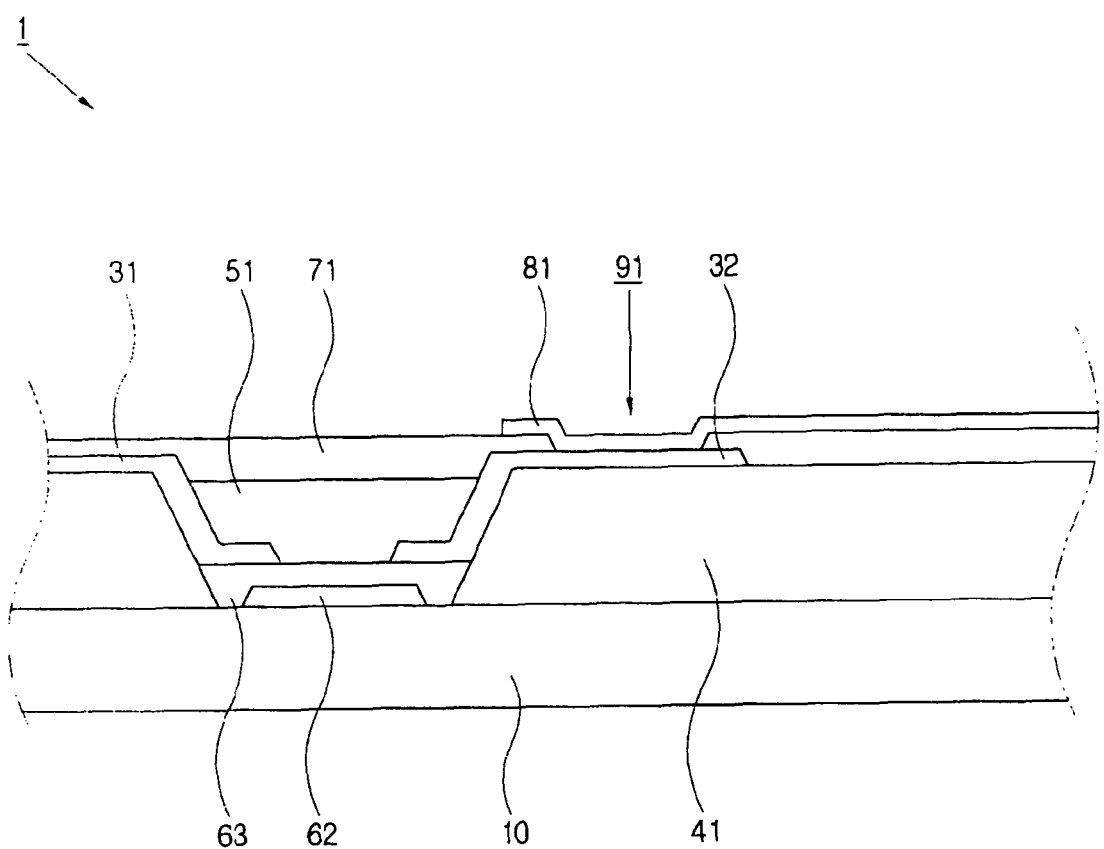

As shown in FIG. 7, a TFT substrate 1 according to a sixth embodiment is formed in a bottom-gate type the way a gate electrode 62 is disposed below an organic semiconductor layer 51, as well. However, a gate insulating layer 63 is disposed only inside a wall 41 in a different way of the fifth embodiment. When the TFT substrate 1 is manufactured in the sixth embodiment, a gate electrode 62 is formed, and then the wall 41 is formed. The gate insulating layer 63 is formed by an ink-jet method using the wall 41. Portions of a source electrode 31 and a drain electrode 32 are formed on the wall 41.

According to the sixth embodiment, there is no process except forming the passivation layer 71 after the organic semiconductor layer 51 is formed, therefore there may be less quality deterioration of the organic semiconductor layer 51. A TFT substrate according to the present invention may be used for a display device such as an LCD, an organic light emitting diode (OLED), or the like. The OLED is a self-emitting element using an organic material to emit light by being applied with an electrical signal. A cathode layer (pixel electrode), a hole-injecting layer, a hole transport layer, a light-emitting layer, an electron transport layer, an electron-injecting layer, and an anode layer (counter electrode) are laminated in the OLED. A drain electrode of the TFT substrate according to the present invention is electrically connected to the cathode layer, thereby applying a data signal.

It will be apparent to those skilled in the art that various modifications and variation can be made in the present invention without departing from the spirit or scope of the invention. Thus it is intended that the present invention cover the modifications and variations of this invention provided they come within the scope of the appended claims and their equivalents.

What is claimed is:

1. A thin film transistor substrate comprising:
    an insulating substrate;
    a source electrode and a drain electrode which are formed on the insulating substrate and separated from each other and have a channel area therebetween;
    a wall exposing at least portions of the source electrode and the drain electrode, respectively, encompassing the channel area, and formed of fluoropolymer;
    an organic semiconductor layer formed inside the wall, and
    an organic insulating layer disposed on the organic semiconductor layer and formed inside the wall,
    wherein the wall encompasses the organic semiconductor layer and the organic insulating layer.

2. The thin film transistor substrate of claim 1, wherein the wall is made of one selected from the group comprised of poly tetra fluoro ethylene (PTFE), fluorinated ethylene propylene (FEP), poly fluoro alkoxy (PFA), ethylene tetra fluoro ethylene (ETFE), polyvinylidene fluoride (PVDF), and cyclized transparent polymer generated by copolymerization of perfluoro (alkenylfinyl ethers).

3. The thin film transistor substrate of claim 1, wherein the wall is photoresist substance.

4. The thin film transistor substrate of claim 1, wherein the organic semiconductor layer is one of a derivative including substituent of tetracene or pentacene; 4~8 oligothiopene connected to 2, 5 position of thiopene ring;
    perylenetetracarboxilic dianhidride or an imide derivative thereof;
    naphthalenetetracarboxilic dianhydride or an imide derivative thereof; metallized pthalocyanine or a halogenated derivatives thereof, or perylene, coroene or derivatives including substituents thereof; co-oligomer or co-polymer of thienylene and vinylene;
    thiopene; perylene or coroene, or derivatives including substituents thereof; and derivatives including one or more hydrocarbon chains of 1~30 carbons to aromatic or heteroaromatic ring of the aforementioned materials.

5. The thin film transistor substrate of claim 1, wherein the organic semiconductor layer is formed by an ink-jet method.

6. The thin film transistor substrate of claim 1, wherein the source electrode and the drain electrode are made of indium tin oxide (ITO) or indium zinc oxide (IZO).

7. The thin film transistor substrate of claim 1, further comprising a light shield layer disposed between the insulating substrate and the source electrode and between the insulating substrate and the drain electrode, and corresponding to the channel area; and an insulating layer disposed on the light shield layer.

8. The thin film transistor substrate of claim 1, further comprising a gate electrode disposed on the organic insulating layer.

9. The thin film transistor substrate of claim 8, wherein the organic insulating layer is not higher than the wall.

10. The thin film transistor substrate of claim 8, further comprising a passivation layer disposed on the gate electrode, wherein the passivation layer is not higher than the wall.

11. A method of making a thin film transistor substrate comprising:
    forming a source electrode and a drain electrode which are disposed on an insulating substrate and separated from each other and have a channel area therebetween;
    forming a wall exposing at least portions of the source electrode and the drain electrode, respectively, encompassing the channel area, and formed of fluoropolymer;
    forming an organic semiconductor layer inside the wall; and
    forming an organic insulating layer on the organic semiconductor layer and inside Wall,
    wherein the wall encompasses the organic semiconductor layer and the organic insulating layer.

12. The method of making the thin film transistor substrate of claim 11, wherein the wall is made of one selected from the group comprised of poly tetra fluoro ethylene (PTFE), fluorinated ethylene propylene (FEP), poly fluoro alkoxy (PFA), ethylene tetra fluoro ethylene (ETFE), polyvinylidene fluoride (PVDF), and cyclized transparent polymer generated by copolymerization of perfluoro (alkenylfinyl ethers).

13. The method of making the thin film transistor substrate of claim 11, wherein the wall is formed by depositing a fluoropolymer layer, then patterning the fluoropolymer using a photoresist layer.

14. The method of making the thin film transistor substrate of claim 11, wherein the wall is formed by depositing a photoresist fluoropolymer layer, then exposing and developing the photoresist fluoropolymer layer.

15. The method of making the thin film transistor substrate of claim 11, wherein the organic semiconductor layer is one of a derivative including substituent of tetracene or pentacene; 4~8 oligothiopene connected to 2, 5 position of thiopene ring; perylenetetracarboxilic dianhidride or an imide derivative thereof;
    naphthalenetetracarboxilic dianhydride or an imide derivative thereof; metallized pthalocyanine or a halogenated derivatives thereof; perylene, coroene; co oligomer or co-polymer of thienylene and vinylene;

thiopene; and derivatives including one or more hydrocarbon chains of 1~30 carbons to aromatic or heteroaromatic ring of the aforementioned materials.

16. The method of making the thin film transistor substrate of claim 11, wherein the organic semiconductor layer is formed by an ink-jet method.

17. The method of making the thin film transistor substrate of claim 11, wherein the source electrode and the drain electrode are made of indium tin oxide (ITO) or indium zinc oxide (IZO).

18. The method of making the thin film transistor substrate of claim 11, further comprising forming an organic insulating layer on the organic semiconductor layer with an ink jet method; and forming a gate electrode on the organic insulating layer.

19. The method of making the thin film transistor substrate of claim 18, further comprising forming a passivation layer on the gate electrode with an ink-jet method.

20. A thin film transistor substrate comprising:
an insulating substrate;
a gate electrode disposed on the insulating substrate;
a wall encompassing the gate electrode and formed of fluoropolymer;
a gate insulating layer disposed on the gate electrode and formed inside the wall;
a source electrode and a drain electrode each disposed on the gate insulating layer and separated from each other, wherein portions of the source electrode and the drain electrode are formed on the wall; and
an organic semiconductor layer formed inside the wall.

21. The thin film transistor substrate of claim 1 further comprising a passivation layer disposed on the organic semiconductor layer.

* * * * *